(12) United States Patent
Kim et al.

(10) Patent No.: US 8,026,701 B2
(45) Date of Patent: Sep. 27, 2011

(54) VOLTAGE REGULATOR FOR A SYNCHRONOUS CLOCK SYSTEM TO REDUCE CLOCK TREE JITTER

(75) Inventors: Hyung-Soo Kim, Gyeonggi-do (KR);
Yong-Ju Kim, Gyeonggi-do (KR);
Sung-Woo Han, Gyeonggi-do (KR);
Hee-Woong Song, Gyeonggi-do (KR);
Ic-Su Oh, Gyeonggi-do (KR); Tae-Jin Hwang, Gyeonggi-do (KR); Hae-Rang Choi, Gyeonggi-do (KR); Ji-Wang Lee, Gyeonggi-do (KR); Jae-Min Jang, Gyeonggi-do (KR); Chang-Kun Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 502 days.

(21) Appl. No.: 12/265,908

(22) Filed: Nov. 6, 2008

(65) Prior Publication Data
US 2009/0267579 A1  Oct. 29, 2009

(30) Foreign Application Priority Data
Apr. 24, 2008  (KR) ........................ 10-2008-0038305

(51) Int. Cl.
*G05F 1/652* (2006.01)
(52) U.S. Cl. ........................ 323/233; 323/293
(58) Field of Classification Search .................. 323/233, 323/293, 364
See application file for complete search history.

(56) References Cited

U.S. PATENT DOCUMENTS

| | | | |
|---|---|---|---|
| 6,222,354 B1 | 4/2001 | Song et al. | |
| 7,362,079 B1 | 4/2008 | Maheedhar et al. | |
| 7,365,581 B2 | 4/2008 | Shi et al. | |
| 7,742,893 B2 * | 6/2010 | Confalonieri et al. | ........ 702/107 |
| 2009/0267579 A1 * | 10/2009 | Kim et al. | ........ 323/273 |
| 2010/0156376 A1 * | 6/2010 | Fu et al. | ........ 323/283 |

FOREIGN PATENT DOCUMENTS

| KR | 1020020002883 A | 1/2002 |
|---|---|---|
| KR | 1020040020338 A | 3/2004 |

OTHER PUBLICATIONS

Notice of Allowance issued from Korean Intellectual Property Office on Aug. 20, 2009 with an English Translation.

* cited by examiner

*Primary Examiner* — Jeffrey Sterrett
(74) *Attorney, Agent, or Firm* — IP & T Group LLP

(57) ABSTRACT

A voltage regulator with an adaptive bandwidth, including a first buffer chain, a voltage generating unit, a trimming capacitor unit, a second buffer chain, and a control unit. The first buffer chain delays a clock signal using an external voltage as a supply voltage. The voltage generating unit generates a regulated voltage on the basis a reference voltage. The trimming capacitor unit controls a load capacitance of the voltage generating unit. The second buffer chain delays the clock signal using the regulated voltage as a supply voltage. The control unit adjusts the load capacitance by detecting a delay difference of clocks output from the first and second buffer chains.

16 Claims, 3 Drawing Sheets

VOLTAGE REGULATOR FOR A SYNCHRONOUS CLOCK SYSTEM TO REDUCE CLOCK TREE JITTER

CROSS-REFERENCE TO RELATED APPLICATION

The present invention claims priority of Korean patent application number 10-2008-0038305, filed on Apr. 24, 2008, which is incorporated by reference in its entirety.

BACKGROUND OF THE INVENTION

The present invention relates to a semiconductor memory device, and more particularly to a voltage regulator which is used in a semiconductor memory device and has an adaptive bandwidth.

Semiconductor memory devices are used in various fields. Typically, semiconductor memory devices are used to store a variety of data. Semiconductor memory devices are required to have a high capacity, a high operating speed, a small size, and a low power consumption because semiconductor memory devices are used in various portable devices, such as desktop computers or notebook computers.

In a synchronous clock system requiring a high operating speed, it is important to reduce jitter of a clock tree. The clock tree represents a multi-stage buffering unit disposed between a clock source and a latch in order to control a delay of a clock reaching latches inside a chip receiving the clock from the clock source. The clock tree is used in a CPU or a controller, as well as in a semiconductor memory device, which is a synchronous clock system using a clock.

In the case of the system using the clock tree, jitter of the clock tree is often generated according to noise included during the supply of power, degrading the performance of the system.

In order to reduce the jitter of the clock tree, a voltage regulator is used for separating the power of the clock buffer from noise environments. The voltage regulator can reduce jitter by reducing the noise from the supplied power.

However, the use of a voltage regulator has the following problems. Bands of frequency components are different in each supplied power, and resonance frequencies of the voltage used to generate a system clock are different. In this case, the frequency component of the supplied voltage is different from that used to generate the system clock. Thus, interference between frequencies and noise is increased. Even though a voltage regulator is used, noise is not almost reduced due to interference between frequencies. Therefore, the efficiency that can be obtained from a voltage regulator is much degraded.

SUMMARY OF THE INVENTION

Embodiments of the present invention are directed to providing a voltage regulator having an adaptive bandwidth.

In accordance with an aspect of the present invention, there is provided a voltage regulator, which includes a first buffer chain configured to delay a clock signal using an external voltage as a supply voltage, a voltage generating unit configured to generate a regulated voltage on the basis a reference voltage, a trimming capacitor unit configured to control a load capacitance of the voltage generating unit, a second buffer chain configured to delay the clock signal using the regulated voltage as a supply voltage, and a control unit configured to adjust the load capacitance by detecting a delay difference of clocks output from the first and second buffer chains.

In accordance with another aspect of the present invention, there is provided a voltage regulator, which includes a first buffer chain configured to delay a clock signal using an external voltage as a supply voltage, first and second voltage generating units respectively configured to generate first and second regulated voltages, based on a reference voltage, first and second trimming capacitor units configured to control load capacitances respectively of the first and second voltage generating units, second and third buffer chains configured to delay the clock signal using respectively the first regulated voltage and the second regulated voltage, as a supply voltage, and a control unit configured to adjust the load capacitances by comparing clock signals output from the first and second buffer chains and by comparing clock signals output from the first and third buffer chains.

DESCRIPTION OF SPECIFIC EMBODIMENTS

Hereinafter, a voltage regulator in accordance with the present invention will be described in detail with reference to the accompanying drawings.

Figure 1:
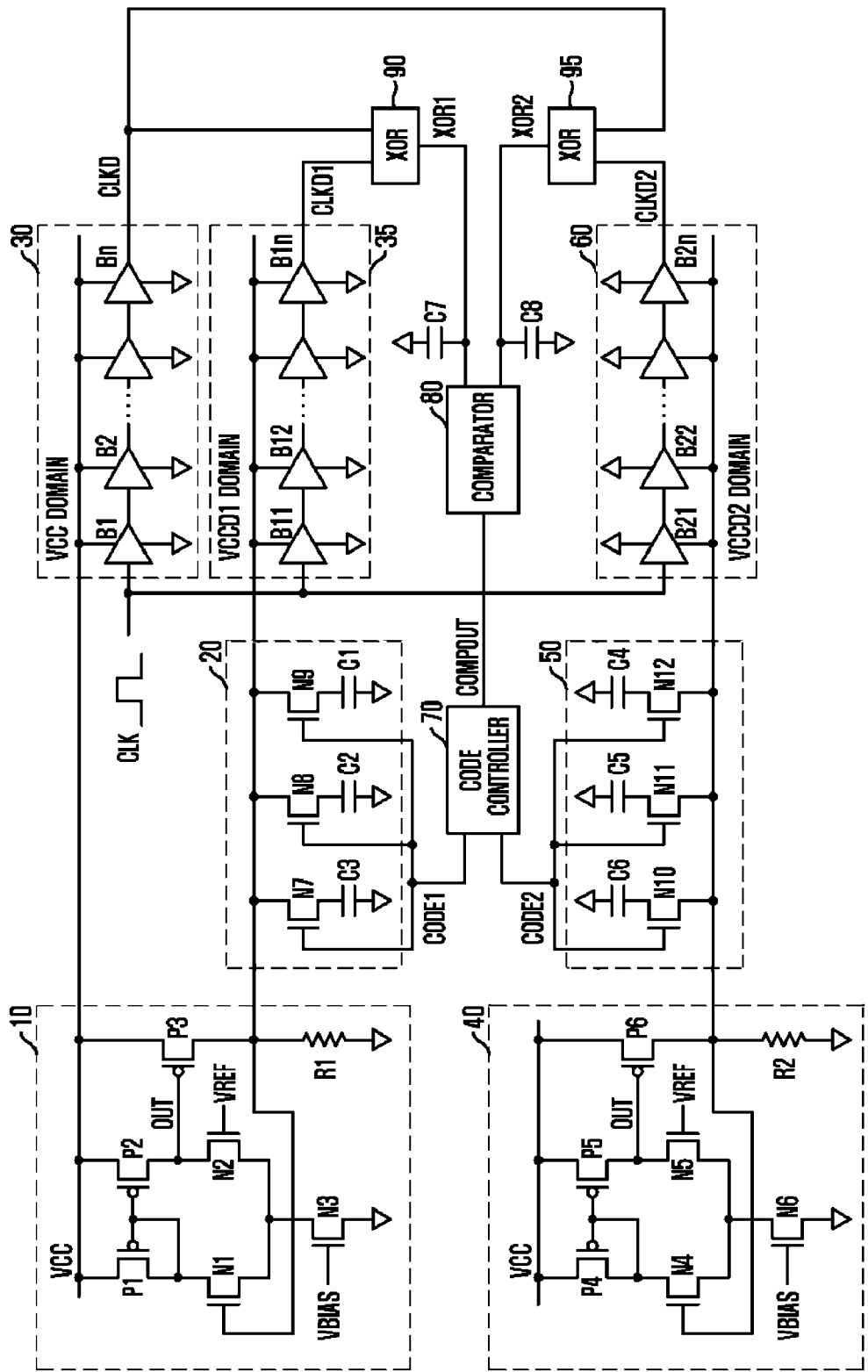
FIG. 1 is a circuit diagram of a voltage regulator in accordance with an embodiment of the present invention.

FIG. 1 is a circuit diagram of a voltage regulator in accordance with an embodiment of the invention.

Referring to FIG. 1, the voltage regulator includes a first voltage regulator 10 for generating a first voltage VCCD1, a second voltage regulator 40 for generating a second voltage VCCD2, a first trimming capacitor unit 20 for controlling a resonance frequency of the first voltage regulator 10, and a second trimming capacitor 50 for controlling a resonance frequency of the second voltage regulator 40.

The voltage regulator further includes a code controller 70 for generating a code signal and controlling an operation of the first and second trimming capacitor units 20 and 50, a first buffer chain 30 operating in a power supply voltage (VCC) domain, a second buffer chain 35 operating in a first voltage domain, and a third buffer chain 60 operating in a second voltage domain.

The voltage regulator also includes a first exclusive OR (XOR) gate 90 for performing a logical operation on a clock CLKD generated from the first buffer chain 30 and a clock CLKD1 generated from the second buffer chain 35, a second XOR gate 95 for performing a logical operation on the clock CLKD generated from the first buffer chain 30 and a clock CLKD2 generated from the third buffer chain 60, and a comparator 80 for comparing an output of the first XOR gate 90 with an output of the second XOR gate 95 to output a comparison signal to the code controller 70. A load capacitor C7 is connected between an output terminal of the first XOR gate 90 and the comparator 80, and a load capacitor C8 is connected between an output terminal of the second XOR gate 95 and the comparator 80. The outputs of the first and second XOR gates 90 and 95 are integrated by the load capacitors C7 and C8 and then input to the comparator 80.

Specifically, the first voltage regulator 10 and the second voltage regulator 40 have the same structure. The first voltage regulator 10 includes a differential comparing unit for differentially comparing a reference voltage VREF and a feedback voltage, a feedback voltage generating unit for dividing an external power supply voltage VCC according to an output of the differential comparing unit, and generating the feedback voltage as the first voltage VCCD1, and a control switching unit for opening/closing a current path of the differential comparing unit in order to operate or stop the differential comparing unit.

The differential comparing unit includes two NMOS transistors N1 and N2 for performing the differential comparison by using the reference voltage VREF inputted externally and the feedback voltage. Sources of the two NMOS transistors N1 and N2 are connected to a common node. Therefore, the reference voltage VREF is applied to a gate of the transistor N2, and the feedback voltage is applied to a gate of the transistor N1.

Two PMOS transistors P1 and P2 are arranged to form a current mirror. A drain of the transistor N1 is serially connected to the PMOS transistor P1, and an external power supply voltage VCC is applied to a source of the PMOS transistor P1. Also, a drain of the transistor N2 of the comparing unit is serially connected to the PMOS transistor P2, and the external power supply voltage VCC is applied to a source of the PMOS transistor P2.

The control switching unit includes an NMOS transistor N3 having a drain connected to the common node of the comparing unit, a source connected to a ground voltage terminal, and a gate receiving an external bias voltage VBIAS.

The feedback voltage generating unit includes a PMOS transistor P3 operated by an output signal OUT of the differential comparing unit. The PMOS transistor P3 has a gate receiving the output signal OUT of the differential comparing unit, a source connected to the external power supply voltage (VCC) terminal, and a drain serving as an output terminal of the first voltage regulator 10. The feedback voltage generating unit further includes a voltage division resistor R1 between the output terminal and the ground voltage terminal. The gate of the transistor N1 of the comparing unit is also connected to the output terminal. That is, the external power supply voltage VCC is divided by the resistor R1, and the divided feedback voltage turns on the transistor N1 of the comparing unit.

The second voltage regulator 40 includes NMOS transistors N4 to N6, PMOS transistors P4 to P6, and a resistor R2 in the same configuration as the above-described first voltage regulator 10.

The first and second trimming capacitor units 20 and 50 are implemented in the same circuit configuration. The first trimming capacitor unit 20 includes a plurality of NMOS transistors N7, N8 and N9 and capacitors C3, C2 and C1 serially connected between the output node of the first voltage regulator 10 and the ground voltage terminal, respectively. The NMOS transistors N7, N8 and N9 are controlled by the same code signal CODE1.

The second trimming capacitor unit 50 includes a plurality of NMOS transistors N10, N11 and N12 and capacitors C6, C5 and C4 serially connected between the output node of the second voltage regulator 40 and the ground voltage terminal, respectively. The NMOS transistors N10, N11 and N12 are controlled by the same code signal CODE2. The code signals CODE1 and CODE2 applied to the first and second trimming capacitor units 20 and 50 are provided from the code controller 70.

Each of the first, second and third buffer chains 30, 35 and 60 includes a plurality of buffers connected in parallel. The first buffer chain 30 includes a plurality of buffers B1 to Bn having inputs and outputs connected in a chain form between the external power supply voltage (VCC) terminal and the ground voltage terminal. The start buffer B1 receives a clock signal CLK. That is, in the first buffer chain 30, the plurality of buffers are driven by the external power supply voltage and the ground voltage in response to the clock signal CLK, thereby outputting a first clock signal CLKD.

The second buffer chain 35 includes a plurality of buffers B11 to B1n having inputs and outputs connected in a chain form between the first voltage (VCCD1) terminal and the ground voltage terminal. The start buffer B11 receives the clock signal CLK. That is, in the second buffer chain 35, the plurality of buffers are driven by the first voltage and the ground voltage in response to the clock signal CLK, thereby outputting a second clock signal CLKD1.

The third buffer chain 60 includes a plurality of buffers B21 to B2n having inputs and outputs connected in a chain form between the second voltage (VCCD2) terminal and the ground voltage terminal. The start buffer B21 receives the clock signal CLK. That is, in the third buffer chain 60, the plurality of buffers are driven by the second voltage and the ground voltage in response to the clock signal CLK, thereby outputting a third clock signal CLKD2.

An operation of the voltage regulator in accordance with the embodiment of the invention will be described below.

Figure 2:
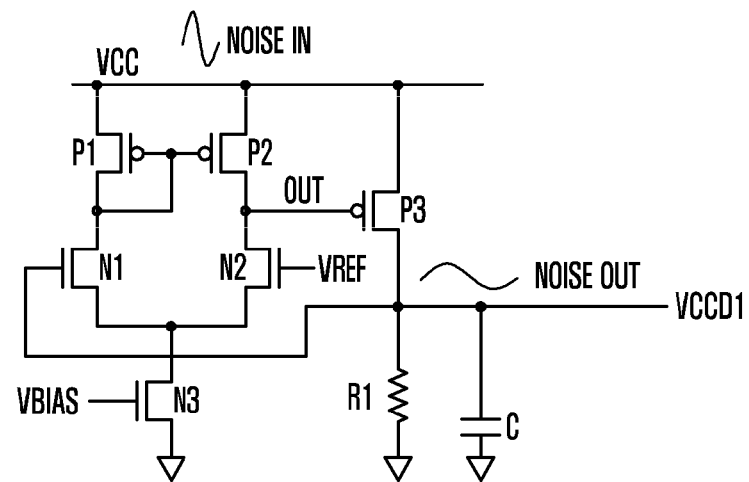
FIG. 2 is a circuit diagram of a typical voltage regulator.
Figure 3:
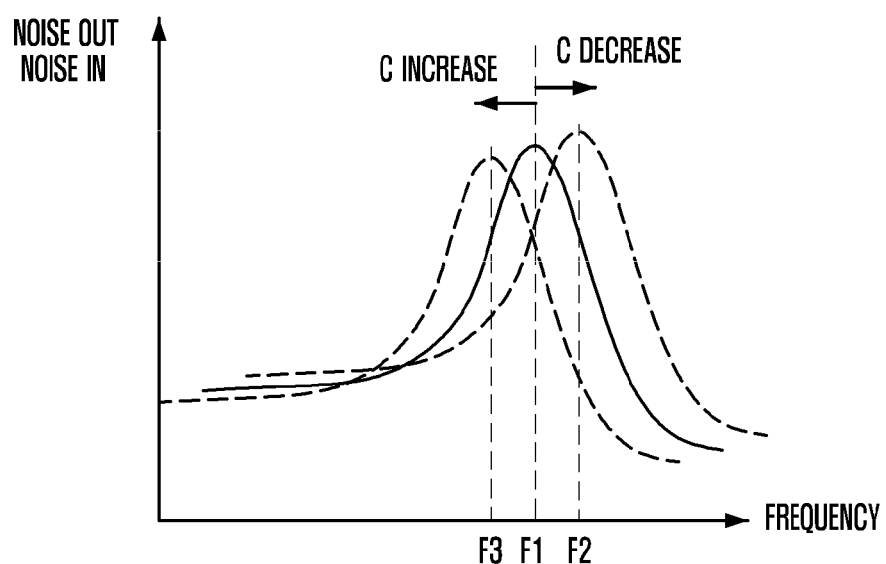
FIG. 3 is a characteristic graph of an output noise with respect to an input noise in a voltage regulator.

As illustrated in FIGS. 2 and 3, the resonance frequency for the output noise with respect to the input noise in the voltage regulator is changed according to the load capacitor C. That is, if the capacitance of the load capacitor C increases, the resonance frequency for the output noise/the input nose decreases; and, if the capacitance of the load capacitor C decreases, the resonance frequency for the output noise/input noise increases.

Therefore, the capacitance of the load capacitor is controlled using the knowledge that the resonance frequency of the voltage regulator is a function of the load capacitor. At this point, the capacitance of the load capacitor is controlled by measuring a delay difference of the buffer chains using the power supply voltage and the voltages generated from the two voltage regulators as the supply voltages, and applying the delay difference to the capacitance of the load capacitor of the voltage regulator.

The first voltage regulator 10 and the second voltage regulator 20 perform the differential comparison with the reference voltage to generate the voltages. The bandwidth of the first voltage regulator 10 is set by the capacitance of the load capacitor determined by the first trimming capacitor unit 20. Likewise, the bandwidth of the second voltage regulator 40 is set by the capacitance of the load capacitor determined by the second trimming capacitor unit 50.

Meanwhile, the first code signal CODE1 generated under control of the code controller 70 is supplied to the first trimming capacitor unit 20, and the second code signal CODE2 is supplied to the second trimming capacitor unit 50. Therefore, the first voltage regulator 10 and the second voltage regulator 40 have different bandwidths according to the code signals generated from the code controller 70. In this way, the signal generated from the first voltage regulator 10 is the regulated first voltage VCCD1, and the signal generated from the second voltage regulator 40 is the regulated second voltage VCCD2.

Figure 4:
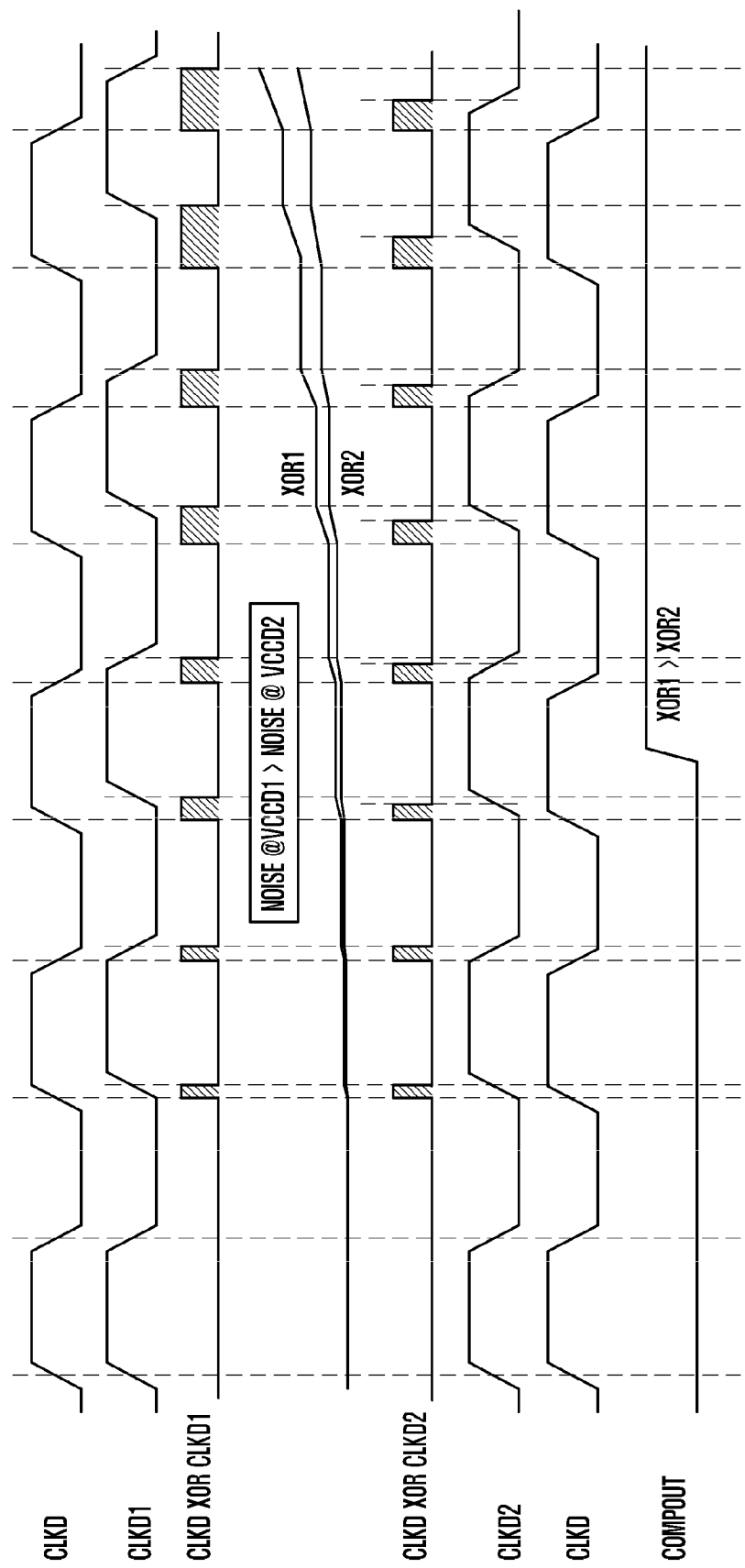
FIG. 4 is a graph showing an operation characteristic of the voltage regulator in accordance with the embodiment of the invention.

The regulated first voltage VCCD1 is applied as the supply voltage to the buffers B11 to B1n of the second buffer chain 35, and the regulated second voltage VCCD2 is applied as the supply voltage to the buffers B21 to B2n of the third buffer chain 60. The second buffer chain 35 receives the first voltage VCCD1 as the supply voltage to generate the second clock signal CLKD1. Likewise, the third buffer chain 60 receives the second voltage VCCD2 as the supply voltage to generate the third clock signal CLKD2. The first buffer chain 30 receives the unregulated external power supply voltage VCC as the supply voltage to generate the first clock signal CLKD. The clock signals generated from the first, second and third buffer chains 30, 35 and 60 are illustrated in FIG. 4.

The clock signals generated from the first and second buffer chains 30 and 35 are XOR-ed by the XOR gate 90, and the clock signals generated from the first and third buffer chains 30 and 60 are XOR-ed by the XOR gate 95. The XOR gate 90 generates a high signal as long as a phase difference between the first clock signal CLKD and the second clock signal CLKD1. Also, the XOR gate 95 generates a high signal as long as a phase difference between the first clock signal CLKD and the third clock signal CLKD2.

The output signals XOR1 and XOR2 of the XOR gates 90 and 95 are integrated by the capacitors C7 and C8, which of a voltage magnitude is changed in proportion to an area of the high signal state generated from the XOR gates 90 and 95. The signals XOR1 and XOR2 are illustrated in FIG. 4.

The comparator 80 compares the two signals to generate a rectangular wave signal corresponding to a difference of the two signals. The code controller 70 receives the rectangular wave signal generated from the comparator 80 and controls the code signals applied to the first and second trimming capacitor units 20 and 50.

The code controller 70 controls the code signals applied to the first and second trimming capacitors 20 and 50, and again controls the bandwidths of the voltage regulators 10 and 40. That is, as illustrated in FIGS. 2 and 3, the resonance frequency for the output noise/the input noise in the voltage regulator is controlled according to the load capacitor.

If the resonance frequency of the voltage regulator having the output of the first voltage VCCD1 is close to the noise frequency on the power supply voltage VCC, the noise level of the first voltage VCCD1 is greater than the noise level of the second voltage VCCD2.

Also, only periods where the first voltage VCCD1 and the second voltage VCCD2 are lower than the power supply voltage VCC are illustrated in FIG. 4. The phase of the clock signal CLKD commonly XOR-ed is faster than those of the clock signals CLKD1 and CLKD2 output from the second and third buffer chains 35 and 60. In this case, the output XOR1 of the XOR gate 90 is higher than the output XOR2 of the XOR gate 95. This means that more noise component is contained in the first voltage VCCD1.

Therefore, the code controller 70 compares several code combinations, finds a code value corresponding to the lowest output XOR1, and sets the capacitance of the first trimming capacitor unit 20. The code controller 70 controls the capacitance of the capacitor by adjusting turn-on amount of the transistors N7, N8 and N9 of the first trimming capacitor unit 20.

In order to reduce jitter of the clock tree provided with the clock buffers, the voltage regulator is used to separate the power of the clock buffer from the noise environment. The clock delay is performed by using the output voltage of the voltage regulator as the supply voltage, and the optimal load capacitance of the voltage regulator is found by the clock delay difference. Therefore, the jitter of the clock tree is minimized, and the load capacitance determining the bandwidth of the voltage regulator is adaptively controlled according to the detection of the clock delay difference, thereby reducing the burden on re-design. Furthermore, the design cost and time can be reduced. Moreover, the margin can be ensured and the operating speed can be increased.

While the invention has been described with respect to specific embodiments, it will be apparent to those skilled in the art that various changes and modifications may be made without departing from the spirit and scope of the invention as defined in the following claims.

What is claimed is:

1. A voltage regulator, comprising:
   a first buffer chain configured to delay a clock signal using an external voltage as a supply voltage;
   a voltage generating unit configured to generate a regulated voltage on the basis of a reference voltage;
   a trimming capacitor unit configured to control a load capacitance of the voltage generating unit;
   a second buffer chain configured to delay the clock signal using the regulated voltage as a supply voltage; and
   a control unit configured to adjust the load capacitance by detecting a delay difference of clocks output from the first and second buffer chains.

2. The voltage regulator as recited in claim 1, wherein the control unit includes:
   a comparator configured to detect the delay difference of the clocks output from the first and second buffer chains; and
   a code controller configured to generate a code according to a detection value of the comparator.

3. The voltage regulator as recited in claim 2, wherein the trimming capacitor unit includes a switching element and a capacitor serially connected between an output terminal of the voltage generating unit and a ground voltage terminal.

4. The voltage regulator as recited in claim 3, wherein the switching element includes an NMOS transistor.

5. The voltage regulator as recited in claim 3, wherein a degree of turn-on of the NMOS transistor is controlled according to a code value of the code controller.

6. The voltage regulator as recited in claim 3, wherein the trimming capacitor unit includes plural pairs of the switching element and the capacitor in parallel.

7. A voltage regulator, comprising:
   a first buffer chain configured to delay a clock signal using an external voltage as a supply voltage;
   first and second voltage generating units respectively configured to generate first and second regulated voltages, based on a reference voltage;
   first and second trimming capacitor units configured to control load capacitances respectively of the first and second voltage generating units;
   second and third buffer chains configured to delay the clock signal using respectively the first regulated voltage and the second regulated voltage, as a supply voltage; and
   a control unit configured to adjust the load capacitances by comparing clock signals output from the first and second buffer chains and by comparing clock signals output from the first and third buffer chains.

8. The voltage regulator as recited in claim 7, wherein the control unit includes:
   a first operation unit configured to perform a logical operation on an output of the first buffer chain and an output of the second buffer chain;
   a second operation unit configured to perform a logical operation on an output of the first buffer chain and an output of the third buffer chain;
   a comparing unit configured to detect a delay difference of signals output from the first and second operation units; and
   a code controller configured to generate codes according to a detection value of the comparing unit.

9. The voltage regulator as recited in claim 8, wherein the first and second operation units includes an exclusive OR (XOR) gate.

10. The voltage regulator as recited in claim 9, wherein an integral value of an output signal of the XOR gate is input to the comparing unit.

11. The voltage regulator as recited in claim 8, wherein the code controller adjusts the load capacitances to remove the detected delay difference of the signals.

12. The voltage regulator as recited in claim 8, wherein the first trimming capacitor unit includes a first switching element and a first capacitor between an output terminal of the first voltage generating unit and a ground voltage terminal, and the second trimming capacitor unit includes a second switching element and a second capacitor between an output terminal of the second voltage generating unit and the ground voltage terminal.

13. The voltage regulator as recited in claim 12, wherein the switching elements include an NMOS transistor.

14. The voltage regulator as recited in claim 13, wherein a degree of turn-on of the NMOS transistor is controlled according to a code value of the code controller.

15. The voltage regulator as recited in claim 14, wherein each of the first and second trimming capacitor units includes plural pairs of the switching element and the capacitor in parallel.

16. The voltage regulator as recited in claim 8, wherein the comparing unit generates a rectangular wave signal corresponding to the delay difference of signals output from the first and second operation units.

* * * * *